United States Patent [19]

Tsuchiya

[11] Patent Number: 5,461,335

[45] Date of Patent: Oct. 24, 1995

[54] DELAY CIRCUIT MANUFACTURABLE BY SEMICONDUCTOR ELEMENTS

[75] Inventor: Chikara Tsuchiya, Kawasaki, Japan

[73] Assignee: Fujitsu Limited, Kanagawa, Japan

[21] Appl. No.: 946,721

[22] Filed: Sep. 18, 1992

[30] Foreign Application Priority Data

Sep. 18, 1991 [JP] Japan .................. 3-237792

[51] Int. Cl.$^6$ ............................ H03K 5/13; H03K 5/159
[52] U.S. Cl. .......................................... 327/280; 327/359
[58] Field of Search ..................... 307/494, 595, 307/597, 602, 603, 608, 525; 327/278, 280, 287, 356, 359

[56] References Cited

U.S. PATENT DOCUMENTS

| | | | |
|---|---|---|---|
| 4,518,878 | 5/1985 | Moulding | 307/602 |
| 4,801,827 | 1/1989 | Metz | 307/602 |
| 5,144,626 | 9/1992 | Funatsu et al. | 307/525 |
| 5,243,240 | 9/1993 | Murakami et al. | 307/602 |

*Primary Examiner*—Willis R. Wolfe
*Attorney, Agent, or Firm*—Nikaido, Marmelstein, Murray & Oram

[57] ABSTRACT

A delay circuit includes a first filter circuit responsive to an input signal and outputting a first output signal having first-order low pass characteristics with respect to the input signal, a second filter circuit responsive to the input signal and outputting a second output signal having first-order high pass characteristics with respect to the input signal, and a difference computing circuit responsive to the first and second output signals and outputting a difference signal therebetween as an output signal of the delay circuit. By the constitution, it is possible to reduce an attenuation factor irrespective of the input signal frequency and obtain a relatively long and easily changeable delay time in a wide frequency band.

5 Claims, 5 Drawing Sheets

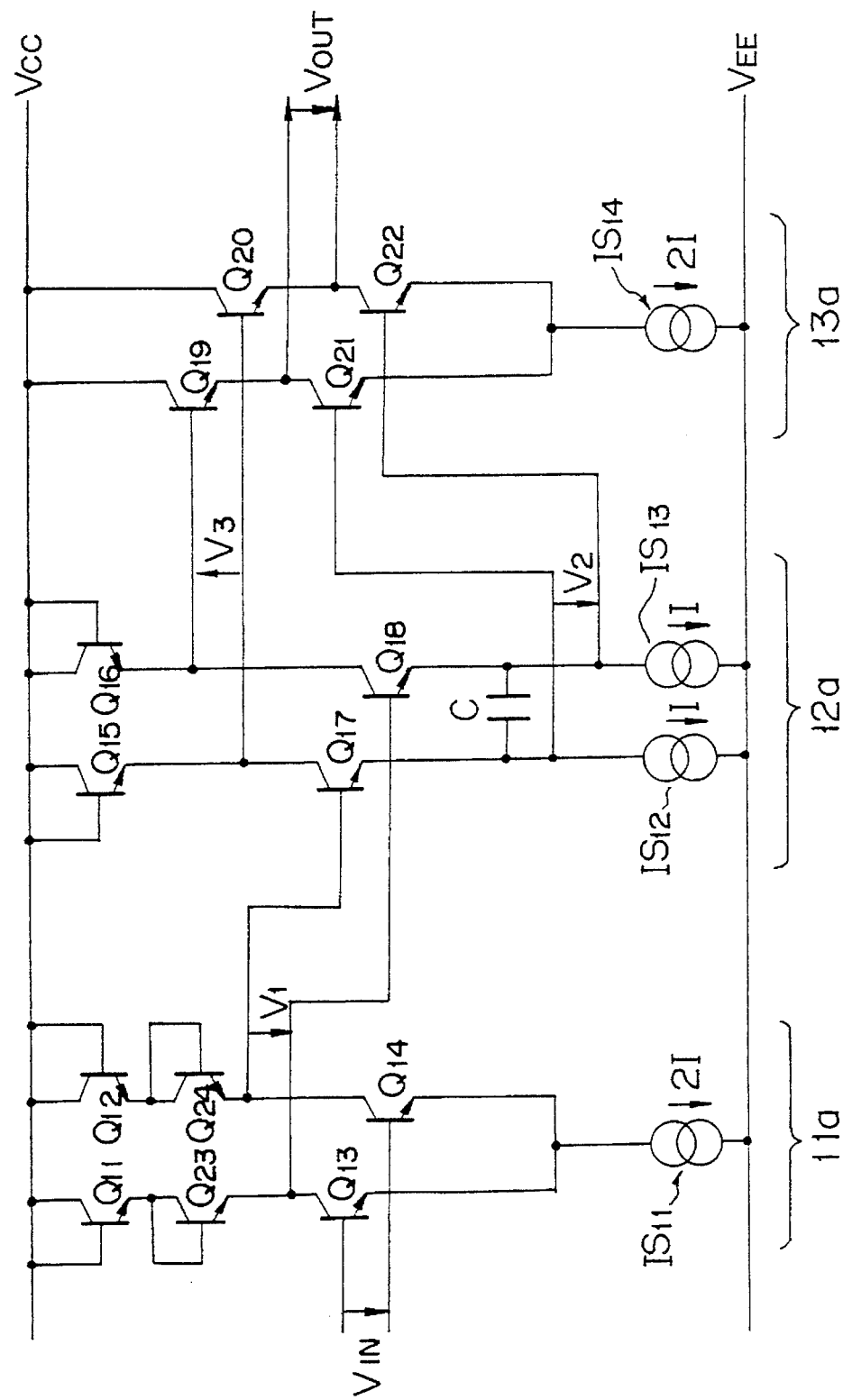

DELAY CIRCUIT MANUFACTURABLE BY SEMICONDUCTOR ELEMENTS

BACKGROUND OF THE INVENTION

1. Field of the Invention

The present invention relates to a delay circuit, more particularly, to a delay circuit manufacturable by semiconductor elements and used for digital signal processing and analog signal processing.

In analog circuits, a delay circuit is used for processing various signals, for example, as a ghost canceller in a television signal circuit, or as a pulse shaper in a hard disk. On the other hand, in digital circuits, a delay circuit is used for regulating signal timings. For example, a digital filter is in a category of such a delay circuit. A digital filter generally includes a plurality of delay circuits each having a constant time lag and connected in a cascade connection, where predetermined weights are added to respective signals at the connection points between the delay circuits and thus addition and subtraction of the weighted signals are carried out. Thus, delay circuits are widely utilized in various applications.

2. Description of the Related Art

Delay circuits are generally constituted using passive elements such as capacitors, inductance components and the like, or using active elements such as transistors and the like.

With respect to delay circuits using passive elements, however, there are posed a number of problems. For example, where the delay circuit is connected by multiple stages, the attenuation factor of the delayed signal becomes large due to resistance components occurring in series with inductance components. Also, since respective values of the inductance components and the capacitors are constant, it is difficult to easily change the delay time. Furthermore, since the inductance components cannot be manufactured by semiconductor elements, it is impossible to realize a small size, high performance and low cost of the delay circuit.

On the other hand, delay circuits using active elements pose a problem in that, where a relatively long delay time is obtained, the frequency band of the delayed output signal becomes narrow.

Note, the problems in the prior art will be explained later in detail in contrast with the preferred embodiments of the present invention.

SUMMARY OF THE INVENTION

An object of the present invention is to provide a a delay circuit which can reduce an attenuation factor irrespective of an input signal frequency and obtain a relatively long and easily changeable delay time in a wide frequency band, while being manufacturable by semiconductor elements.

According to the present invention, there is provided a delay circuit including a first filter circuit responsive to an input signal and outputting a first output signal having first-order low pass characteristics with respect to the input signal, a second filter circuit responsive to the input signal and outputting a second output signal having first-order high pass characteristics with respect to the input signal, and a difference computing circuit responsive to the first and second output signals and outputting a difference signal therebetween as an output signal of the delay circuit.

BRIEF DESCRIPTION OF THE DRAWINGS

Other objects and features of the present invention will be described hereinafter in detail by way of preferred embodiments with reference to the accompanying drawings, in which:

FIGS. 5a and 5b are circuit diagrams showing a constitution of the delay circuit according to another embodiment of the present invention.

DESCRIPTION OF THE PREFERRED EMBODIMENTS

Throughout the description, identical references used in connection with the drawings indicate like constituent elements and thus the repetition of explanation thereof is omitted. Also, in the description below, the term "transistor" indicates an NPN bipolar transistor so long as a specific definition is not added thereto.

First, for a better understanding of the preferred embodiments of the present invention, the related prior art will be explained with reference to FIGS. 1 and 2.

Figure 1:
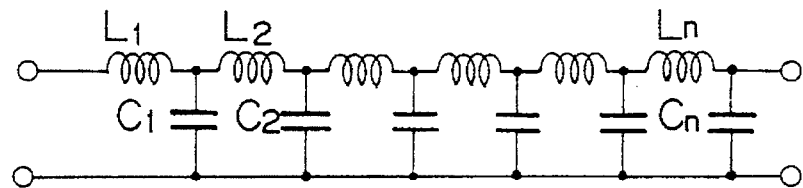
FIG. 1 is a circuit diagram showing a constitution of a prior art delay circuit.

FIG. 1 illustrates a constitution of a prior art delay circuit.

The circuit of FIG. 1 shows an example of an analog delay circuit using passive elements and is constituted by a combination of a plurality of inductance elements $L_1, L_2, \ldots, L_n$ connected in series and a plurality of capacitors $C_1, C_2, \ldots, C_n$ connected in parallel. With respect to a relatively low frequency band, the circuit provides a delay time below.

$$\tau = n \cdot L \, C^{1/2}$$

Note, $L_1 = L_2 = \ldots = L_n = L$, and $C_1 = C_2 = \ldots = C_n = C$.

The delay circuit shown in FIG. 1 poses a number of problems. First, where the circuit is connected by multiple stages in a cascade connection, the attenuation factor of the delayed signal becomes large due to resistance components occurring in series with inductance components. Second, to variably change the delay time, taps must be provided halfway in the circuit to thus change the wiring because respective values of the inductance elements Li and the capacitors Ci are constant. Third, it is impossible to manufacture the delay circuit by semiconductor elements to thus realize a small size, high performance and low cost because the inductance components cannot be manufactured by semiconductor elements.

Figure 2:
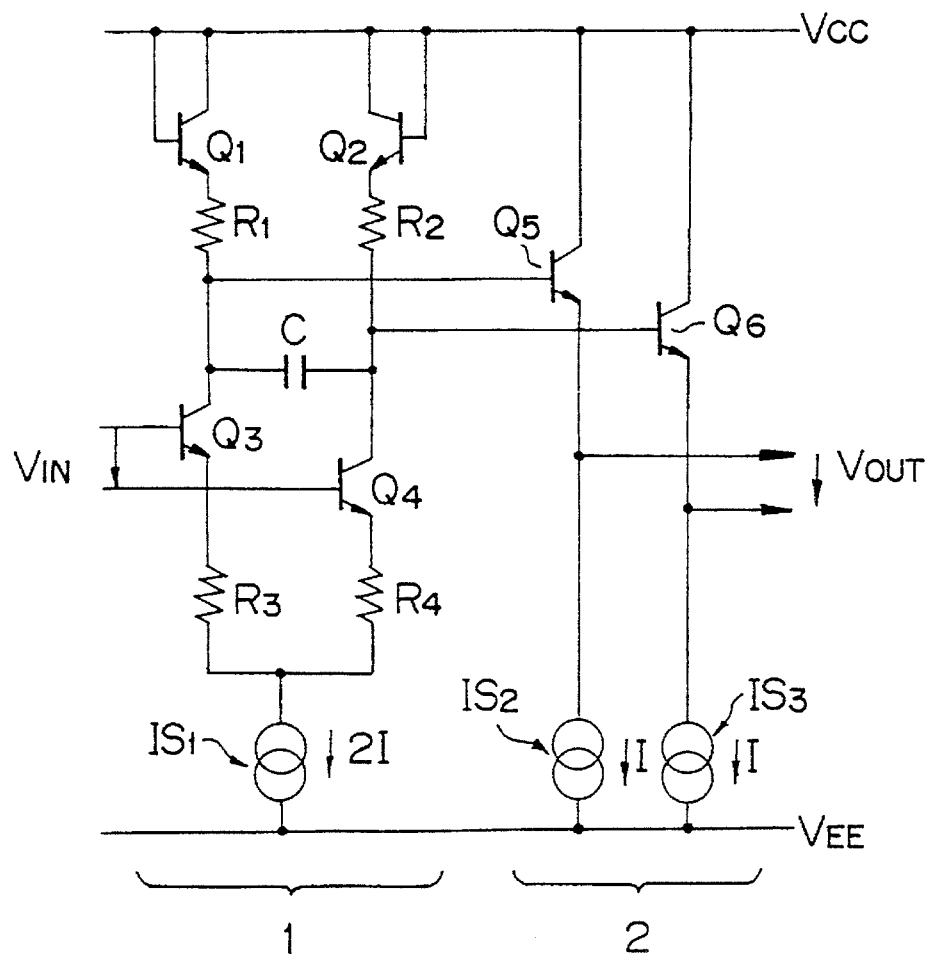
FIG. 2 is a circuit diagram showing a constitution of another prior art delay circuit.

FIG. 2 illustrates a constitution of another prior art delay circuit.

The circuit of FIG. 2 shows an example of a delay circuit using active elements and is constituted by a filter stage 1 with first-order low pass characteristics and an output stage 2. The filter stage 1 includes a differential amplifier constituted by transistors $Q_1$ to $Q_4$, resistors $R_1$ to $R_4$ and a source $IS_1$ feeding a constant current 2I, plus a capacitor C. In the constitution, the ratio of an alternating current input $V_{IN}$ to an alternating current output $V_{OUT}$ is expressed as follows:

$$V_{IN}/V_{OUT} = h_{FE}/(1+h_{FE}) \quad (1)$$
$$= (R_1 + R_2 + 2V_T/I)/$$
$$(R_3 + R_4 + 2V_T/I) \times$$
$$1/\{1 + j\omega(R_1 + R_2 + 2V_T/I)C\}$$

where $V_T = kT/q$. Note, $h_{FE}$ indicates a current amplification factor of an NPN transistor; k a Boltzmann's constant; T an absolute temperature; and q a charge of an electron. Assuming that $h_{FE} \gg 1$, and $R_1 = R_2 = R_3 = R_4 = R$, the equation (1) is modified as follows:

$$V_{IN}/V_{OUT} = 1/\{1 + j \cdot 2\omega(R + V_T/I)C\} \quad (2)$$
$$= 1/(1 + j\omega/\omega_C)$$

where $1/\omega_c = 2(R + V_T/I)C$.

Accordingly, where the circuit of FIG. 2 is connected by n stages in a cascade connection, the entire amplification factor G, phase difference φ and delay time τ are expressed as follows:

$$G = [1/\{1+(\omega/\omega_c)^2\}^{1/2}]^n \quad (3)$$

$$\phi = -n \cdot \tan^{-1}(\omega/\omega_c)$$

$$\tau = -d\phi/d\ t = (n/\omega_c)/\{1+(\omega/\omega_c)^2\} \quad (4)$$

Furthermore, assuming that $\omega \ll \omega_c$, the equations (3) and (4) are modified as follows:

$$G = 1/\{1+\omega/(\omega_c/n)\} \quad (5)$$

$$\tau = n/\omega_c \quad (6)$$

The delay circuit shown in FIG. 2 poses a problem in that, where a relatively long delay time is obtained, the frequency band of the delayed output signal becomes narrow. This is because ω must be selected to be much smaller than $\omega_c$ to lengthen the delay time, as seen from the equation (4).

Figure 3:
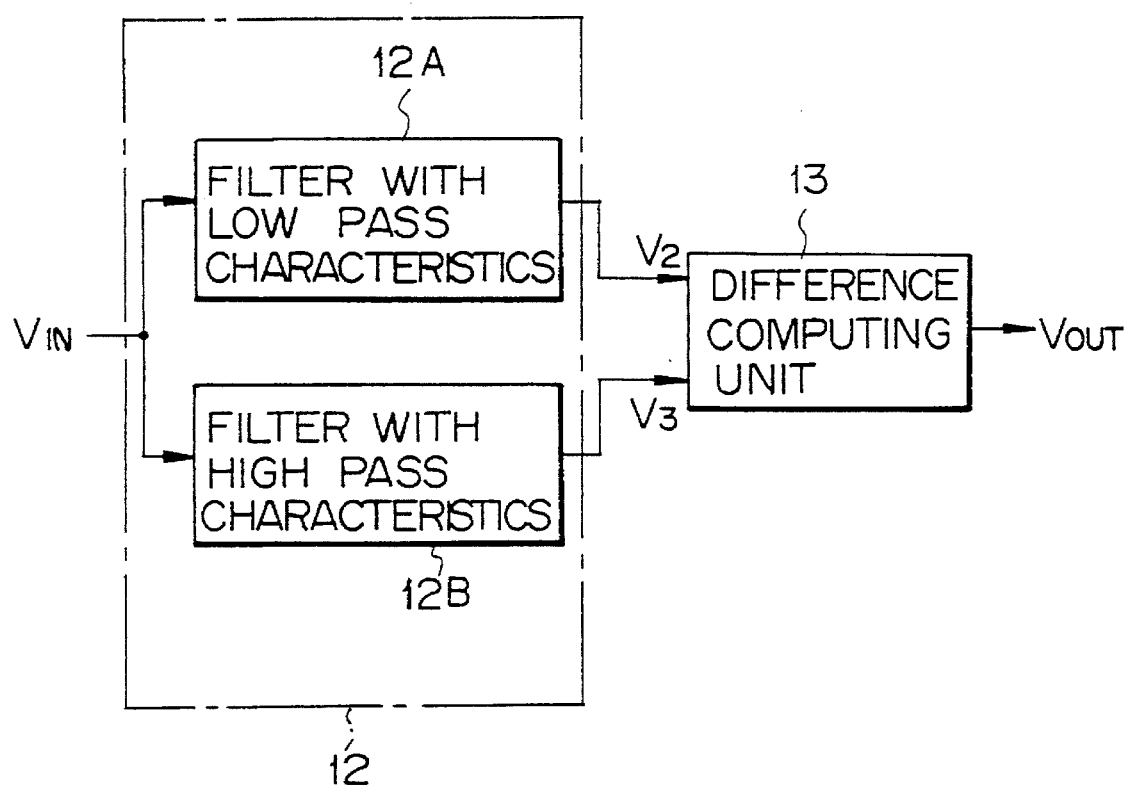
FIG. 3 is a block diagram showing a fundamental constitution of the delay circuit according to the present invention.

FIG. 3 illustrates a fundamental constitution of the delay circuit according to the present invention.

In the illustration, reference 12 denotes a filter unit including a first filter (circuit) 12A with low pass characteristics and a second filter (circuit) 12B with high pass characteristics. The first filter 12A responds to an input signal $V_{IN}$ and outputs a first output signal $V_2$ having first-order low pass characteristics with respect to the input signal. In a like manner, the second filter 12B responds to the input signal $V_{IN}$ and outputs a second output signal V, having first-order high pass characteristics with respect to the input signal. Reference 13 denotes a difference computing unit (circuit) which responds to the first and second output signals and outputs a difference signal therebetween as an output signal $V_{OUT}$ of the delay circuit.

According to the above constitution, since the output signal of the delay circuit is defined by the difference signal between the signal with low pass characteristics and the signal with high pass characteristics, it can have the entire band pass characteristics with respect to the input signal. Therefore, it is possible to make the amplification factor one (1), i.e., to make the attenuation factor zero (0). Also, by suitably selecting semiconductor elements constituting the filter unit 12 and the difference computing unit 13, it is possible to obtain a relatively long and easily changeable delay time in a wide frequency band.

Next, the preferred embodiments of the present invention will be explained with reference to FIGS. 4, 5a and 5b.

Figure 4:
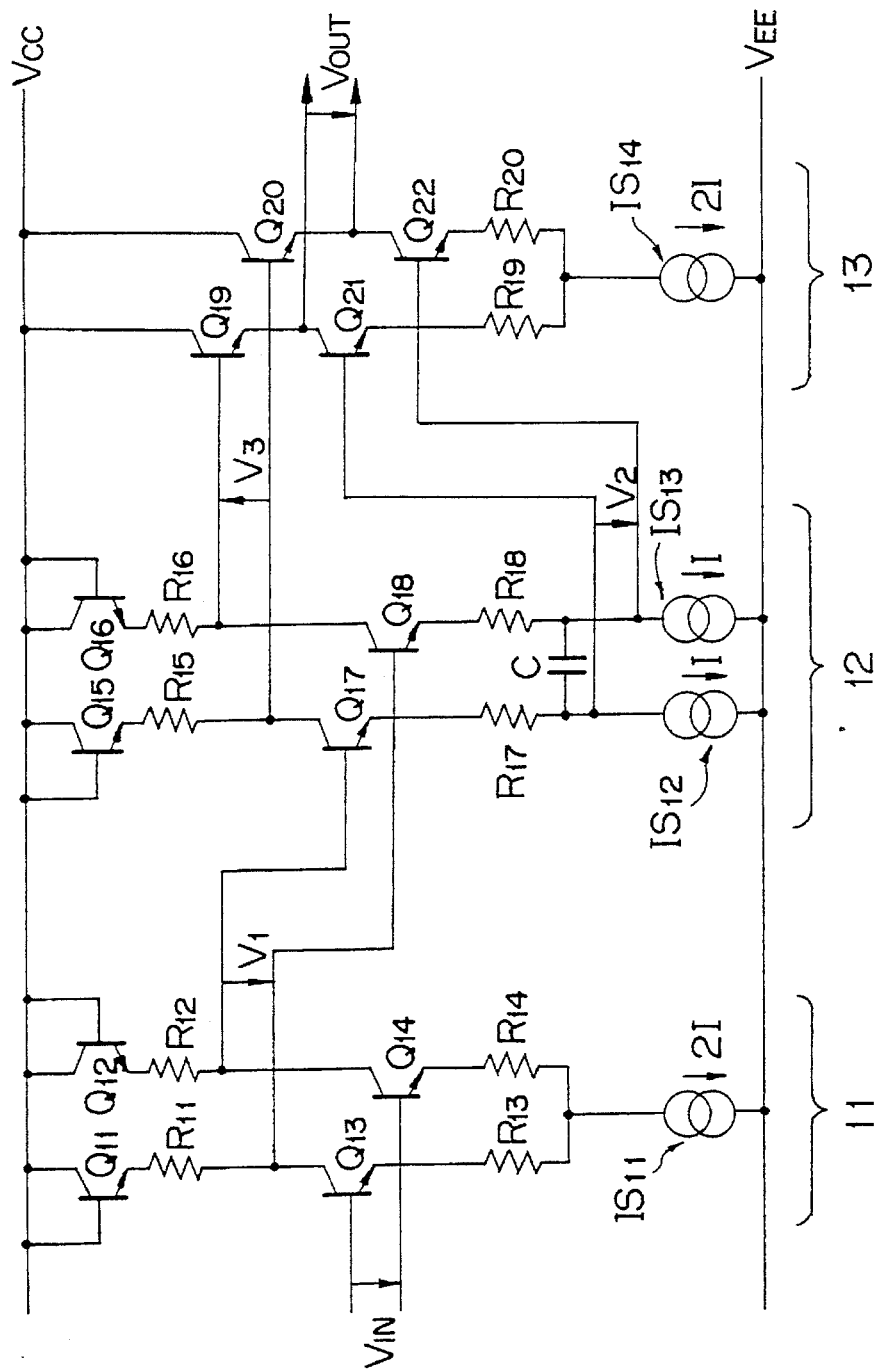
FIG. 4 is a circuit diagram showing a constitution of the delay circuit according to an embodiment of the present invention.

FIG. 4 illustrates a constitution of the delay circuit according to an embodiment of the present invention.

The illustrated delay circuit includes an input stage 11 which receives a difference voltage input signal $V_{IN}$ and outputs a signal $V_1$, a filter stage 12 which receives the output signal $V_1$ of the input stage 11 and outputs a signal $V_2$ and a signal $V_3$, and a difference computing stage 13 which computes a difference signal between the signals $V_2$ and $V_3$ and outputs an output signal $V_{OUT}$ of the delay circuit.

The input stage 11 includes transistors $Q_{11}$, $Q_{12}$ each having a collector connected to a higher voltage power supply line Vcc and a base connected to the collector, a resistor $R_{11}$ having one end connected to an emitter of the transistor $Q_{11}$, a resistor $R_{12}$ having one end connected to an emitter of the transistor $Q_{12}$, a transistor $Q_{13}$ having a collector connected to another end of the resistor $R_{11}$ and a base receiving the input signal $V_{IN}$, a transistor $Q_{14}$ having a collector connected to another end of the resistor $R_{12}$ and a base receiving the input signal $V_{IN}$, resistors $R_{13}$, $R_{14}$ each having one end connected to a corresponding emitter of the transistors $Q_{13}$, $Q_{14}$, and a constant current source $IS_{11}$ connected between each another end of the resistors $R_{13}$, $R_{14}$ and a lower voltage power supply line $V_{EE}$ and feeding a constant current 2I. The input stage 11 functions as a level converter, a buffer and an amplifier.

The output signal $V_1$ of the input stage 11 is taken from between the collectors of the transistors $Q_{13}$ and $Q_{14}$. In this case, where the current amplification factor $h_{FE}$ of each transistor $Q_{11}$–$Q_{14}$ is much higher than 100, the output signal $V_1$ is expressed as follows:

$$V_1 = 2(R+V_T/I)/2(R+V_T/I) \times V_{IN} = V_{IN} \quad (7)$$

The filter stage 12 includes transistors $Q_{15}$, $Q_{16}$ each having a collector connected to the power supply line Vcc and a base connected to the collector, a resistor $R_{15}$ having one end connected to an emitter of the transistor $Q_{15}$, a resistor $R_{16}$ having one end connected to an emitter of the transistor $Q_{16}$, a transistor $Q_{17}$ having a collector connected to another end of the resistor $R_{15}$ and a base receiving the signal $V_1$, a transistor $Q_{16}$ having a collector connected to another end of the resistor $R_{16}$ and a base receiving the signal $V_1$, resistors $R_{17}$, $R_{18}$ each having one end connected to a corresponding emitter of the transistors $Q_{17}$, $Q_{18}$, a constant current source $IS_{12}$ connected between another end of the resistor $R_{17}$ and the power supply line $V_{EE}$ and feeding a constant current I, a constant current source $IS_{13}$ connected between another end of the resistor $R_{18}$ and the power supply line $V_{EE}$ and feeding a constant current I, and a capacitor C connected between the another ends of the resistors $R_{17}$ and $R_{18}$.

The signal $V_2$ of the filter stage 12 is taken from across the capacitor C and the signal $V_3$ thereof is taken from between the collectors of the transistors $Q_{17}$ and $Q_{18}$. The signals $V_2$, $V_3$ are expressed as follows:

$$V_2 = 1/\{1 - j \cdot 2\omega(R + V_T/I)C\} \times V_1 \quad (8)$$
$$= 1/\{1 - j \cdot 2\omega(R + V_T/I)C\} \times V_{IN}$$

$$V_3 = V_1 - V_2 \quad (9)$$
$$= \{j \cdot 2\omega(R + V_T/I)C\}/\{1 + j \cdot 2\omega(R + V_T/I)C\} \times V_{IN}$$

As is obvious from the equations (8) and (9), the signal $V_2$ has first-order low pass characteristics with respect to the input signal $V_{IN}$, and the signal $V_3$ has first-order high pass characteristics with respect to the input signal $V_{IN}$.

The difference computing stage 13 includes transistors $Q_{19}$, $Q_{20}$ each having a collector connected to the power supply line Vcc and a base receiving the signal $V_3$, a transistor $Q_{21}$ having a collector connected to an emitter of the transistor $Q_{19}$ and a base receiving the signal $V_2$, a transistor $Q_{22}$ having a collector connected to an emitter of the transistor $Q_{20}$ and a base receiving the signal $V_2$, resistors $R_{19}$, $R_{20}$ each having one end connected to a corresponding emitter of the transistors $Q_{21}$, $Q_{22}$, and a constant current source $IS_{14}$ connected between each another end of the resistors $R_{19}$, $R_{20}$ and the power supply line $V_{EE}$ and feeding a constant current $2I$.

The output signal $V_{OUT}$ of the difference computing stage 13 is taken from between the collectors of the transistors $Q_{21}$ and $Q_{22}$ and expressed as follows:

$$V_{OUT} = -V_3 + V_2 \quad (10)$$
$$= \{1 - j \cdot 2\omega(R + V_T/I)C\}/\{1 + j \cdot 2\omega(R + V_T/I)C\} \times V_{IN}$$

As seen from the equation (10), the output signal $V_{OUT}$ of the delay circuit has the entire band pass characteristics with respect to the input signal $V_{IN}$. Assuming that $1/\omega_c = 2(R + V_T/I)$, the equation (10) is modified as follows:

$$V_{OUT} = (1 - j\omega/\omega_c)/(1 + j\omega/\omega_c) \times V_{IN} \quad (11)$$

Therefore, the amplification factor G of the delay circuit of FIG. 4 is expressed as follows:

$$G = V_{OUT}/V_{IN} \quad (12)$$
$$= |(1 - j\omega/\omega_C)/(1 + j\omega/\omega_C)|$$
$$= 1$$

As seen from the equation (12), the amplification factor is not dependent on the input signal frequency. Also, even if the circuit of FIG. 4 is connected by n stages in a cascade connection, there is no attenuation occurring.

On the other hand, the phase difference $\phi$ is expressed as follows:

$$\phi = -2 \tan^{-1}(\omega/\omega_c)$$

Accordingly, the delay time $\tau$ is expressed as follows:

$$\tau = -d\phi/dt \quad (13)$$
$$= (2/\omega_C)/\{1 + (\omega/\omega_C)^2\}$$

As explained above, according to the present embodiment, it is possible to reduce the attenuation factor irrespective of the input signal frequency and obtain a relatively long and easily changeable delay time in a wide frequency band. Also, since no inductance component is necessary, it is possible to manufacture the delay circuit by semiconductor elements. This contributes to a small size, high performance and low cost.

Figure 5B:
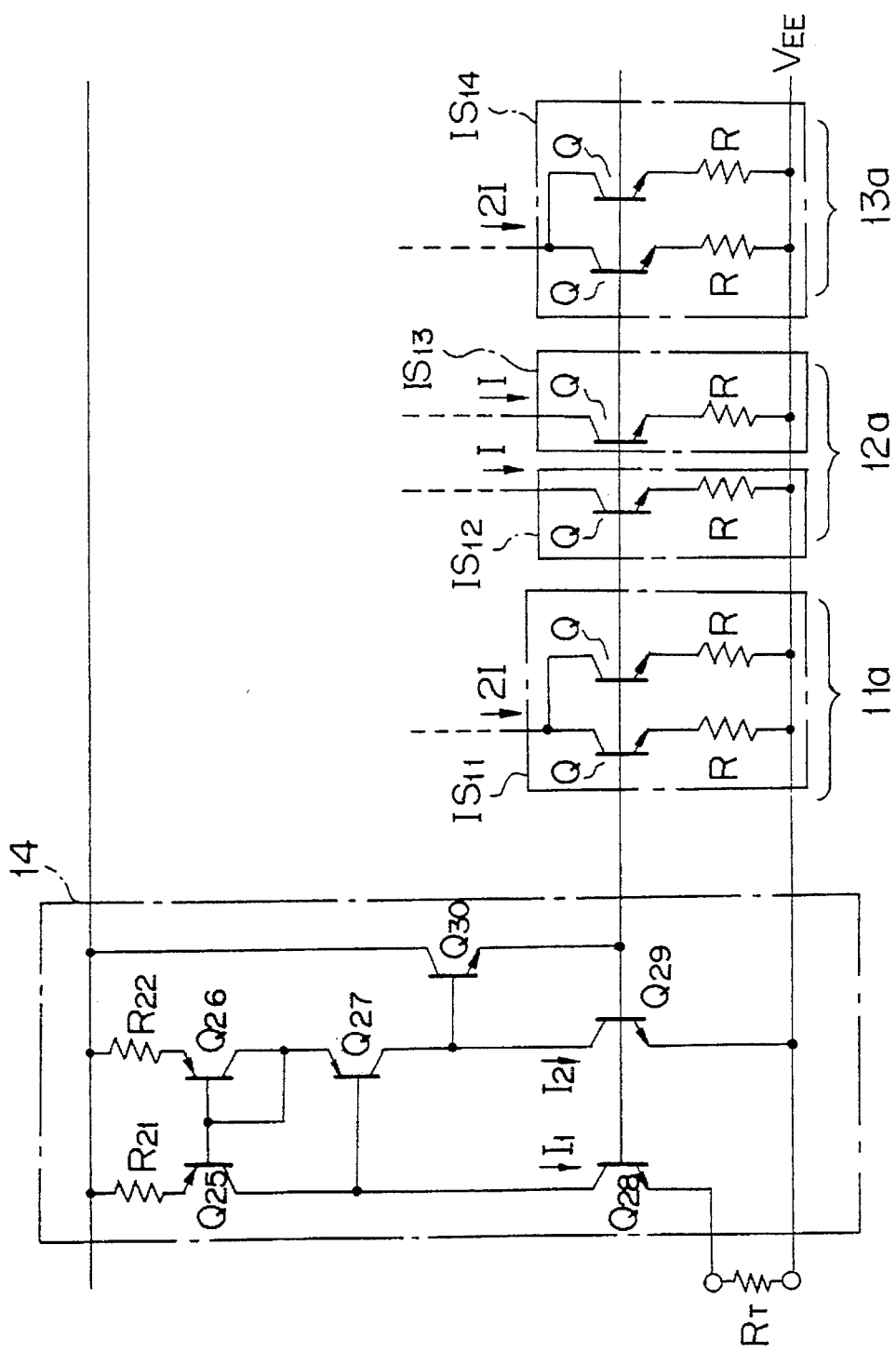

FIGS. 5a and 5b illustrate a constitution of the delay circuit according to another embodiment of the present invention.

The illustrated delay circuit is different from the constitution of FIG. 4 in that the resistors $R_{13}$ to $R_{20}$ are removed and the resistors $R_{11}$ and $R_{12}$ are substituted by a pair of transistors $Q_{23}$ and $Q_{24}$, and in that a constant current source 14 is provided for feeding the constant current (I) in proportional to the absolute temperature (T). Non-use of the resistors is for the reason below. Namely, where resistors are formed by semiconductor elements, they are generally formed in the form of a diffusion resistance. The diffusion resistance has a considerable temperature coefficient, normally 1500 to 3000 ppm/deg, and thus the delay time $\tau$ indicated by the equation (13) also has a considerable temperature coefficient accordingly. In other words, where the delay circuit includes resistors in the form of diffusion resistances, the delay time is changed depending upon the temperature coefficient. The delay circuit of the present embodiment improves the disadvantage.

The constant current source 14 shown in FIG. 5b includes resistors $R_{21}$, $R_{22}$ each having one end connected to the power supply line Vcc, a PNP transistor $Q_{25}$ having an emitter connected to another end of the resistor $R_{21}$, a PNP transistor $Q_{26}$ having an emitter connected to another end of the resistor $R_{22}$ and a base connected to both its collector and a base of the transistor $Q_{25}$, a PNP transistor $Q_{27}$ having an emitter connected to the collector of the transistor $Q_{26}$ and a base connected to a collector of the transistor $Q_{25}$, a transistor $Q_{28}$ having a collector connected to the collector of the transistor $Q_{25}$ and an emitter connected to one end of an externally attached resistor $R_T$, a transistor $Q_{29}$ having a collector connected to the collector of the transistor $Q_{27}$ and an emitter connected to another end of the resistor $R_T$, and a transistor $Q_{30}$ connected between the power supply line Vcc and each base of the transistors $Q_{28}$, $Q_{29}$ and responsive to a potential at the collector of the transistor $Q_{27}$.

The externally attached resistor $R_T$ is selected to have an extremely small temperature coefficient. Thus, by changing a value of the resistor $R_T$, it is possible to change the delay time. Note, a transistor indicated by reference Q and a resistor indicated by reference R constitute the constant current source in the input stage 11a, the filter stage 12a and the difference computing stage 13a, respectively. In the constant current source 14, the transistors $Q_{25}$ to $Q_{27}$ constitute a current mirror circuit. Therefore, the following relationship is given.

$$I_1 = I_2$$

To this end, it is necessary to select the area of the emitter region of the transistor $Q_{28}$ to be n times that of the transistor $Q_{29}$. Namely, $$R_T \cdot I_1 = V_T \cdot \log_e n$$
$$\therefore I = (V_T/R_T) \log_e n$$
$$= (kT/qR_T) \log_e n$$

Thus, it is possible to make the value of the constant current I proportional to the absolute temperature T.

Although the present invention has been disclosed and described by way of two embodiments, it is apparent to those skilled in the art that other embodiments and modifications of the present invention are possible without departing from the spirit or essential features thereof.

I claim:

1. A delay circuit comprising:
   a first filter circuit responsive to an input signal and outputting a first output signal having first-order low pass characteristics with respect to the input signal;
   a second filter circuit responsive to the input signal and outputting a second output signal having first-order high pass characteristics with respect to the input signal; and
   a difference computing circuit responsive to the first and second output signals and outputting a difference signal therebetween as an output signal of the delay circuit;

wherein the first filter circuit and the second filter circuit are constituted by a filter circuit in the form of a differential amplifier, wherein the filter circuit in the form of a differential amplifier comprises a first pair of transistors each having a collector connected to a higher voltage power supply line and a base connected to the collector, a first pair of resistors each having one end connected to a corresponding emitter of the first pair of transistors, a second pair of transistors each having a collector connected to a corresponding another end of the first pair of resistors and a base receiving a signal of emitter-coupled logic level, a second pair of resistors each having one end connected to a corresponding emitter of the second pair of transistors, a pair of constant current sources each connected between a corresponding another end of the second pair of resistors and a lower voltage power supply line, and a capacitor connected between the another ends of the second pair of resistors, the first output signal with low pass characteristics being taken from across the capacitor, the second output signal with high pass characteristics being taken from between the collectors of the second pair of transistors.

2. A delay circuit as set forth in claim 1, wherein the difference computing circuit comprises a third pair of transistors each having a collector connected to the higher voltage power supply line and a base receiving the second output signal, a fourth pair of transistors each having a collector connected to a corresponding emitter of the third pair of transistors and a base receiving the first output signal, a third pair of resistors each having one end connected to a corresponding emitter of the fourth pair of transistors, and a constant current source connected between each another end of the third pair of resistors and the lower voltage power supply line, the output signal of the delay circuit being taken from between the collectors of the fourth pair of transistors.

3. A delay circuit as set forth in claim 2, further comprising an input stage circuit responsive to the input signal and generating the signal of emitter-coupled logic level.

4. A delay circuit as set forth in claim 3, wherein the input stage circuit comprises a fifth pair of transistors each having a collector connected to the higher voltage power supply line and a base connected to the collector, a fourth pair of resistors each having one end connected to a corresponding emitter of the fifth pair of transistors, a sixth pair of transistors each having a collector connected to a corresponding another end of the fourth pair of resistors and a base receiving the input signal, a fifth pair of resistors each having one end connected to a corresponding emitter of the sixth pair of transistors, and a constant current source connected between each another end of the fifth pair of resistors and the lower voltage power supply line, the signal of emitter-coupled logic level being taken from between the collectors of the sixth pair of transistors.

5. A delay circuit as set forth in claim 4, wherein each of the constant current sources used in the difference computing circuit and the input stage circuit feeds a constant current double that of each constant current source used in the filter circuit.

\* \* \* \* \*